United States Patent [19]
Yamashita et al.

[11] Patent Number: 5,164,665
[45] Date of Patent: Nov. 17, 1992

[54] IC TESTER

[75] Inventors: Eisaku Yamashita; Ryuji Omura, both of Itami, Japan

[73] Assignee: Mitsubishi Denki Kabushiki Kaisha, Tokyo, Japan

[21] Appl. No.: 874,213

[22] Filed: Apr. 27, 1992

Related U.S. Application Data

[63] Continuation of Ser. No. 660,014, Feb. 25, 1991, abandoned.

[30] Foreign Application Priority Data

Aug. 21, 1990 [JP] Japan .................................. 2-218216

[51] Int. Cl.$^5$ .................................. G01R 31/28
[52] U.S. Cl. .................................. 324/158 R; 324/73.1; 371/27
[58] Field of Search .................. 324/73.1, 158 R; 371/25.1, 27, 68.3

[56] References Cited

U.S. PATENT DOCUMENTS

| | | | |
|---|---|---|---|
| 4,102,491 | 7/1978 | De Vito et al. | 371/25.1 |
| 4,402,055 | 8/1983 | Lloyd et al. | 324/73.1 |
| 4,656,632 | 4/1987 | Jackson | 371/25.1 |
| 4,694,242 | 9/1987 | Peterson et al. | 371/27 |
| 4,760,330 | 7/1988 | Lias, Jr. | 371/15.1 |
| 4,806,852 | 2/1989 | Swan et al. | 371/27 |
| 4,813,042 | 3/1989 | Maaloe et al. | 371/25.1 |
| 4,994,732 | 2/1991 | Jeffrey et al. | 324/158 R |
| 5,025,205 | 6/1991 | Mydill et al. | 324/158 R |

Primary Examiner—Ernest F. Karlsen
Assistant Examiner—William J. Burns
Attorney, Agent, or Firm—Leydig, Voit & Mayer

[57] ABSTRACT

An IC tester having a plurality of tester pins to be connected to input terminals and output terminals of ICs to be tested comnprises: a common timing generator for generating a common timing which is common to all the tester pins; a dedicated timing generator for generating dedicated timings which are independent of each other and respectively dedicated to tester pin units, each of the tester pin units being composed of at least two of the plurality of tester pins; and a setting device for setting the respective dedicated timings generated by the dedicated timing generator to the tester pins of the corresponding tester pin units, the other tester pins selecting the common timing generated by the common timing generator.

2 Claims, 4 Drawing Sheets

IC TESTER

This application is a continuation of application Ser. No. 07/660,014, filed Feb. 25, 1991, now abandoned.

BACKGROUND OF THE INVENTION

1. Field of the Invention

This invention relates to an IC tester for testing the electrical properties of ICs (integral circuits).

2. Description of the Related Art

FIG. 2 shows a conventional IC tester for performing the so-called multi-testing, i.e., the simultaneous testing of a plurality of ICs. The IC tester shown has a prime oscillator 1 for generating reference signals and a timing circuit 2 connected to this prime oscillator 1. The timing circuit 2 includes a plurality of clock circuits 3 and a plurality of strobing circuits 4. The clock circuits 3 are connected to a plurality of selectors 6 through a distribution line 5 and the selectors 6 are connected to respective drivers 7. The strobing circuits 4 of the timing circuit 2 are connected to a plurality of selectors 8 through the distribution line 5 and the selectors 8 are connected to respective comparators 9. The drivers 7 and the comparators 9 are connected to respective tester pins 10.

Next, the operation of this IC tester when testing two ICs simultaneously will be described. First, the tester pins 10 are connected to the respective terminals of the two ICs 11 to be tested. Then, reference signals are supplied from the prime oscillator 1 to the clock circuits 3 and the strobing circuits 4, respectively, of the timing circuit 2. The clock circuits 3 then generate input timing signals of different timings and supply them to the selectors 6. The strobing circuits 4 generate judgment timing signals of different timings and supply them to the selectors 8.

The selectors 6 respectively select the requisite input timing signals in accordance with instructions from a CPU (not shown) and supply them to the corresponding drivers 7. The drivers 7 then generate testing signals on the basis of the input timing signals supplied to them and supply these testing signals to the respective input terminals of the ICs 11 through the tester pins 10. This causes the two ICs to operate in accordance with the respective testing signals supplied to them and emit output signals through their output terminals. These output signals are supplied to the corresponding comparators 9 through the tester pins 10. The selectors 8 select the requisite judgment timing signals in accordance with instructions from the CPU (not shown) and supply them to the corresponding comparators 9. The comparators 9 respectively make a judgment on the output signals from the ICs 11 on the basis of the judgment timing signals supplied, thereby deciding whether the ICs 11 are good or defective.

FIG. 3A shows the inner structure of an IC 11 which has been tested. The IC 11 shown is equipped with an internal circuit 12, which generates output signals on the basis of signals supplied to it through the input terminals 13 of this IC 11. The output signals are emitted through the output terminals 14 of the IC 11. At this time, an output signal S2 is emitted through one of the output terminals 14 with a delay of $\Delta t$ with respect to the corresponding input signal S1, as shown in FIG. 3B, the delay $\Delta t$ being always constant for the IC 11. Accordingly, the IC 11 can be tested correctly when the selectors 6 and 8 select proper input timing signals or proper judgment timing signals.

Further, a plurality of ICs 11 can be tested simultaneously under the same conditions if the same selectors 6 and the same drivers 7, or the same selectors 8 and the same comparators 9, are used for those terminals of the ICs 11 which have the same functions.

However, in the case of an IC used in a microcomputer or the like, i.e, an IC 15 which contains a special internal-clock generating circuit 16 as shown in FIG. 4A, a signal S3 supplied through the input terminal 17 of this IC 15 is divided by the internal-clock generating circuit 16 so as to form an internal clock signal Sc, and the internal circuit 18 of this IC 15 generates an output signal on the basis of this internal clock signal Sc. Thus, the internal circuit 18 operates with a special timing in accordance with the characteristics of the internal clock generating circuit 16, so that, as shown in FIG. 4B, the delay $\Delta T$ of the output signal S4 emitted through the output terminal 19 with respect to the input signal S3 supplied to the input terminal 17 depends upon the timing of the internal clock signal Sc with respect to the input signal S3.

Therefore, an IC 15 which has an internal-clock generating circuit 16, as shown in in FIG. 4A, must be tested with a timing peculiar to this IC 15, which means it is difficult to test a plurality of such ICs simultaneously.

SUMMARY OF THE INVENTION

This invention has been made with a view to eliminating the above problem. It is accordingly an object of the present invention to provide an IC tester which is capable of multiple ICs which operate by internal clock signals.

In order to achieve the above object, this invention provides an IC tester comprising:

common timing generating means for generating a common timing which is common to all the tester pins;

dedicated timing generating means for generating dedicated timings which are independent of each other and respectively dedicated to tester pin units, each of said tester pin units being composed of at least two of said plurality of tester pins; and setting means for setting the respective dedicated timings generated by said dedicated timing generating means to the tester pins of the corresponding tester pin units, the other tester pins selecting the common timing generated by said common timing generating means.

In accordance with this invention, timing generating means generates mutually independent timings for the respective ICs to be tested. These independent timings are provided for a plurality of drivers and comparators.

DESCRIPTION OF THE PREFERRED EMBODIMENTS

Embodiments of this invention will now be described with reference to the accompanying drawing.

Figure 1:
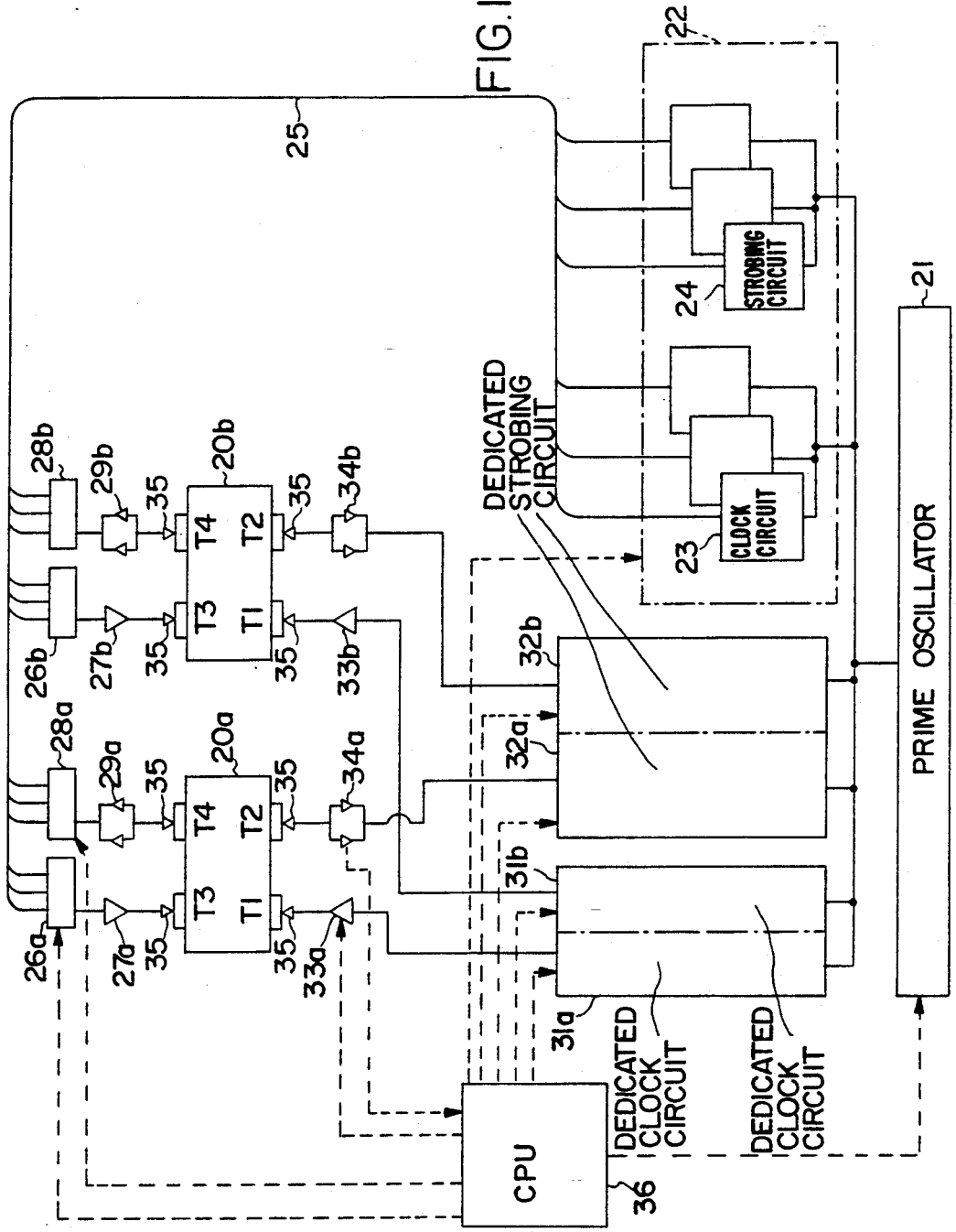
FIG. 1 is a block diagram showing an IC tester in accordance with an embodiment of this invention.
Figure 2:
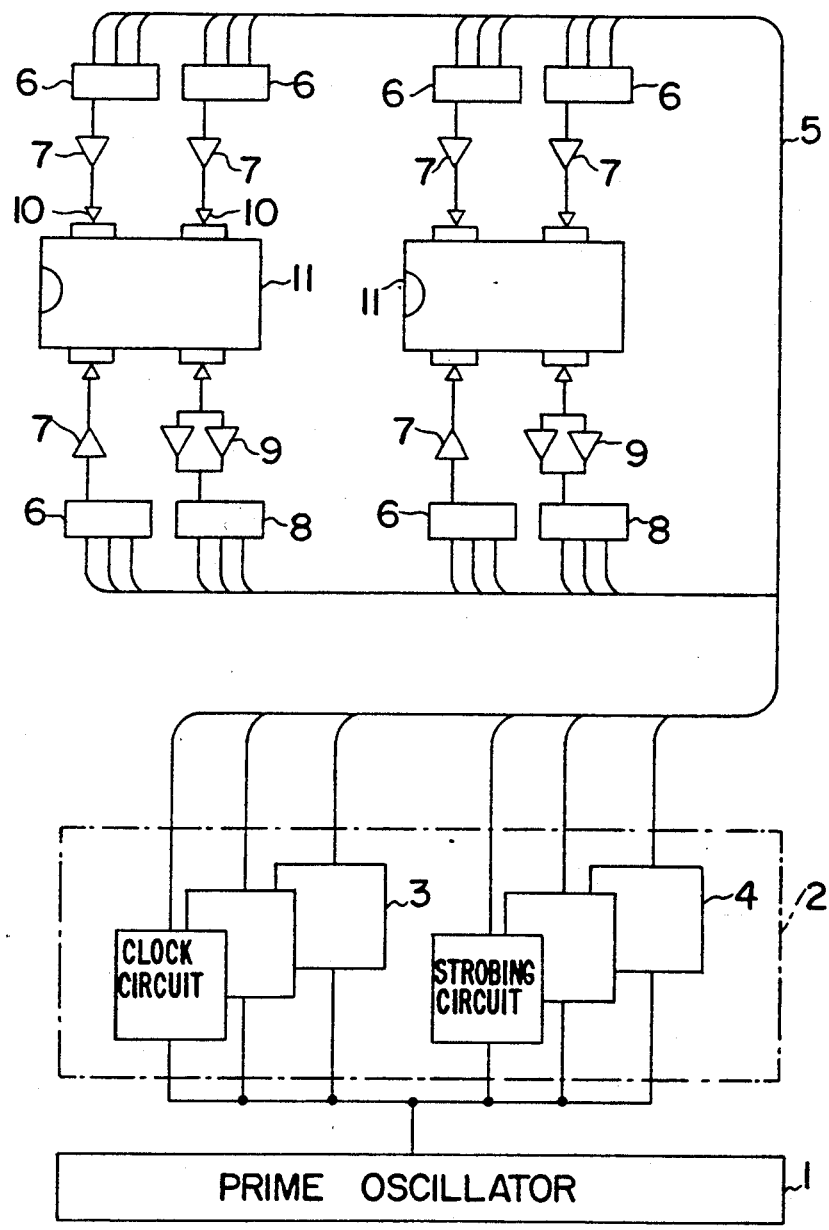
FIG. 2 is a block diagram showing an conventional IC tester.
Figure 3A:
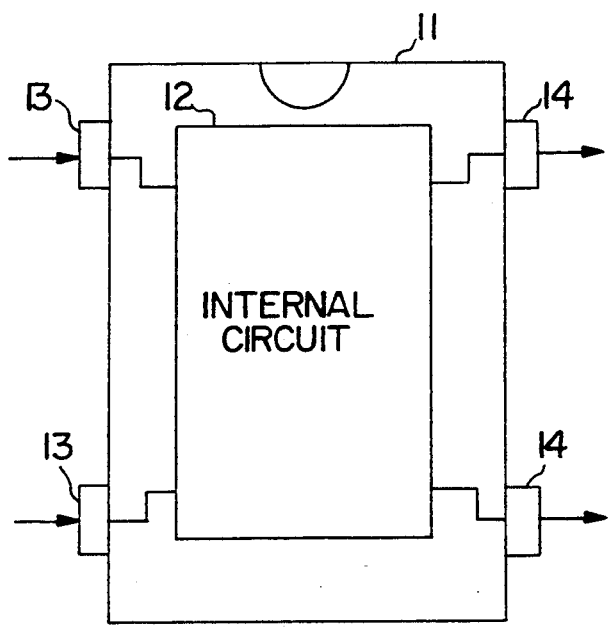
FIG. 3A is a block diagram showing the inner structure of an IC which allows multi-testing by a conventional IC tester.
Figure 3B:
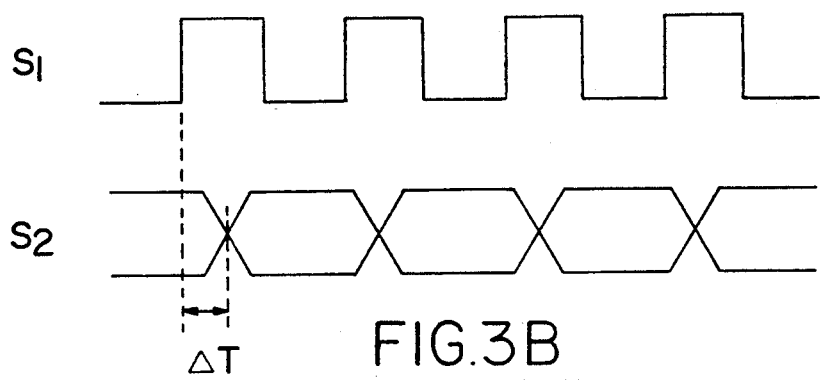
FIG. 3B is a timing chart of the IC shown in FIG. 3A.

FIG. 1 shows an IC tester in accordance with an embodiment of this invention. The IC tester shown has a prime oscillator 21 for generating reference signals and a common timing circuit 22 connected to this prime oscillator 21. The common timing circuit 22 includes a plurality of clock circuits 23 and a plurality of strobing circuits 24. The clock circuits 23 are connected to a plurality of selectors 26a and 26b through a distribution line 25, the selectors 26a and 26b being connected to respective drivers 27a and 27b. The strobing circuits 24 of the common timing circuit 22 are connected to a plurality of selectors 28a and 28b through the distribution line 25, the selectors 28a and 28b being connected to respective comparators 29a and 29b.

Further, connected to the prime oscillator 21 are a dedicated clock circuit 31a and a dedicated strobing circuit 32a, which are dedicated to one IC 20a to be tested, as well as a dedicated clock circuit 31b and a dedicated strobing circuit 32b, which are dedicated to the other IC 20b to be tested. Drivers 33a and 33b are connected to the dedicated clock circuits 31a and 31b, respectively, and comparators 34a and 34b are connected to the dedicated strobing circuits 32a and 32b, respectively. Tester pins 35 are connected to the drivers 27a, 27b, 33a and 33b, as well as the comparators 29a, 29b, 34a and 34b, respectively.

In the illustrated embodiment the prime oscillator 21, the common timing circuit 22, the dedicated clock circuits 31a and 31b, and the dedicated strobing circuits 32a and 32b constitute a timing generating means. Further, a CPU 36, which constitutes the control means, is connected to the respective circuits constituting the timing generating means as well as to the respective selectors, the respective drivers, and the respective comparators. In FIG. 1, the respective connecting lines which connect the CPU 36 to the selectors 26b and 28b, to the drivers 27a, 27b and 33b, and to the comparators 29a, 29b and 34b, are omitted.

Figure 4A:
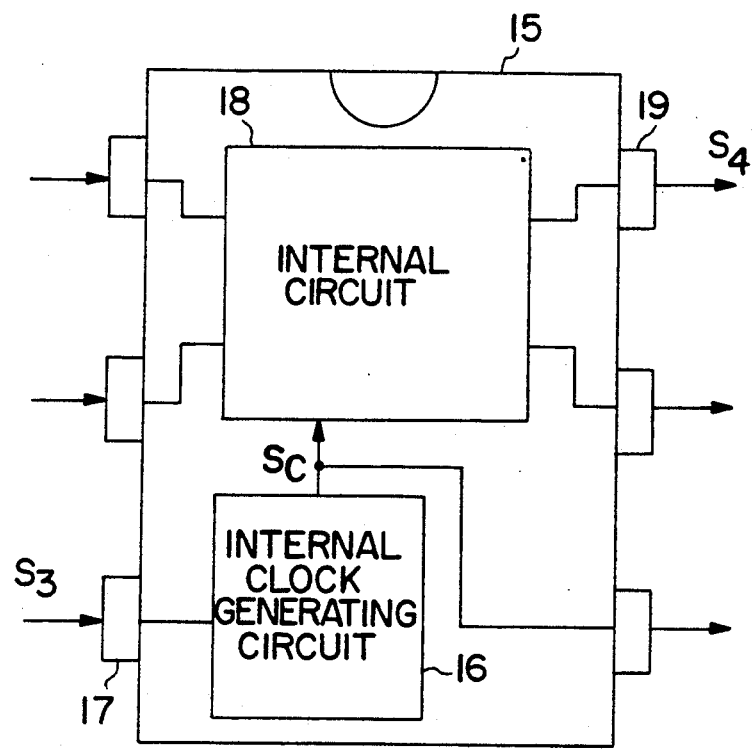
FIG. 4A is a block diagram showing the inner structure of an IC which does not allow multi-testing by a conventional IC tester.
Figure 4B:
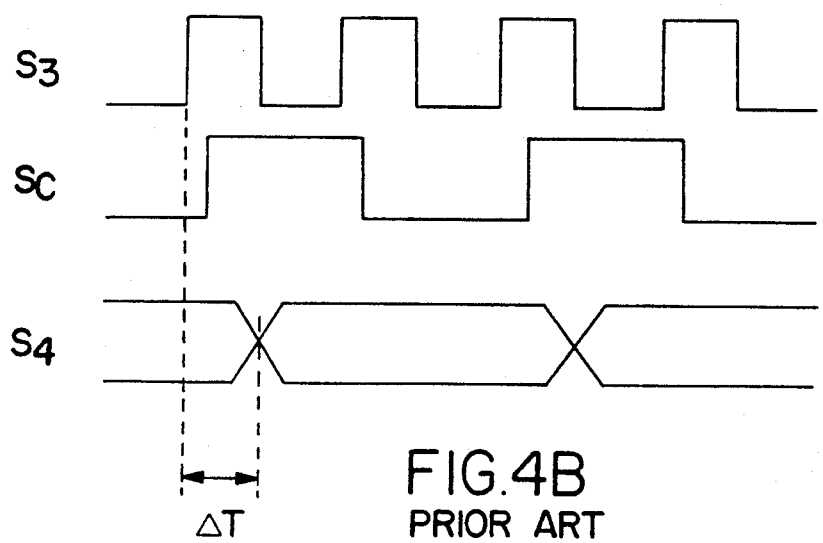
FIG. 4B is a timing chart of the IC shown in FIG. 4A.

Next, the operation of the IC tester of this embodiment when testing two ICs simultaneously will be described. Like the IC 15 shown in FIG. 4A, the IC 20a to be tested is equipped with an internal-clock generating circuit and an internal circuit which operates by internal clocks generated by the internal clock generating circuit. The IC 20a is further equipped with an input terminal T1 and an output terminal T2 which are connected to the above-mentioned internal circuit as well as an input terminal T3 and an output terminal T4 which are not connected to the internal circuit and which deal with signals not depending on the internal clocks. The input terminal T1, the output terminal T2, the input terminal T3, and the output terminal T4, of this IC 20a to be tested, are connected to the driver 33a, the comparator 34a, the driver 27a, and the comparator 29a, respectively, by means of respective tester pins 35. The other IC 20b to be tested has a construction similar to that of the above-described IC 20a and is equipped with input terminals T1, T3 and output terminals T2, T4. The input terminal T1 and the output terminal T2, which are connected to the internal circuit of this IC 20b, are respectively connected to the driver 33b and the comparator 34b, and the input terminal T3 and the output terminal T4, which are not connected to the above internal circuit, are respectively connected to the driver 27b and the comparator 29b.

The CPU 36 supplies the prime oscillator 21 with instruction signals designating the periods of the reference signals to be emitted therefrom. Thus, the prime oscillator 21 generates reference signals having periods which are in conformity with these instructions and supplies these reference signals to the dedicated clock circuits 31a, 31b and the dedicated strobing circuits 32a, 32b. The dedicated clock circuits 31a and 31b generate predetermined timing signals and supply them to the drivers 33a and 33b, and clock signals which are based on these timing signals, are supplied from the drivers 33a and 33b to the respective input terminals T1 of the ICs 20a and 20b. Based on the clock signals thus supplied, signals are emitted through the respective output terminals T2 of the ICs 20a an 20b and are supplied to the dedicated strobing circuits 32a and 32b through the comparators 34 and 34b, respectively. The dedicated strobing circuits 32a and 32b measure the differences in timing between the clock signals and the output signals in the respective ICs 20a and 20b, respectively. On the basis of the timing differences thus measured by the dedicated strobing circuits 32a and 32b, the CPU 36 provides the dedicated clock circuits 31a and 31b with timings which are independent of each other in such a manner that the respective timings of the output signals from the ICs 20a and 20b, i.e., the respective timings of the internal clocks of these ICs, coincide with each other.

Afterwards, the dedicated clock circuits 31a and 31b generate input timing signals having the mutually independent timings set by the CPU 36 and supply them to the drivers 33a and 33b, respectively, and the dedicated strobing circuits 32a and 32b generate judgment timing signals and supply them to comparators 34a and 34b, respectively. The drivers 33a and 33b generate testing signals on the basis of the input timing signals supplied thereto and supply them to the respective input terminals T1 of the ICs 20a and 20b.

The reference signals from the prime oscillator 21 are also supplied to the clock circuits 23 and the strobing circuits 24 of the common timing circuit 22. The clock circuits 23 generate input timing signals having mutually different timings and supply them to the selectors 26a and 26b. The strobing circuits 24 generate judgment timing signals having mutually different timings and supply them to the selectors 28a and 28b. The selectors 26a and 26b respectively select the requisite input timing signals in accordance with the instructions from the CPU 36 and supply them to the corresponding drivers 27a and 27b. The drivers 27a and 27b generate testing signals on the basis of the input timing signals supplied thereto and supply them to the respective input terminals T3 of the ICs 20a and 20b through the respective tester pins 35.

Thus, the two ICs 20a and 20b operate in accordance with the testing signals supplied through the respective input terminals T1 and T3 and emit output signals through the respective output terminals T2 and T4. The output signals emitted through the respective output terminals T2 are supplied through the respective tester pins 35 to the corresponding comparators 34a and 34b, where the output signals are judged on the basis of the judgment timing signals supplied from the dedicated strobing circuits 32a and 32b. The output signals emitted through the respective output terminals T4 of the ICs 20a and 20b are supplied to the corresponding comparators 29a and 29b through the respective tester pins 35. At this time, instructions from the CPU 36 have already been supplied to the respective selectors 28a and 28b. In accordance with these instructions, the selectors 28a and 28b select the requisite judgment timing signals and supply them to the corresponding comparators 29a and 29b. The comparators 29a and 29b make a judgment on the output signals from the respective output terminals T4 of the ICs 20a and 20b.

The CPU decides whether the IC 20a is good or defective in accordance with the judgment results obtained by the comparators 29a and 34a, and decides whether the IC 20b is good or defective in accordance with the judgment results obtained by the comparators 29b and 34b.

Thus, in accordance with this embodiment, the respective operational timings of the two ICs 20a and 20b, which operate by respective internal clocks peculiar to them, are made to coincide with each other by using the dedicated clock circuits 31a, 31b and the dedicated strobing circuits 32a, 32b, thereby making it possible to perform the multi-testing of these two ICs 20a and 20b.

Although the embodiment described above employs a common timing circuit 22 which is common to the two ICs 20a and 20b, it is also possible to connect dedicated clock circuits or dedicated strobing circuits which are independent of each other to all the terminals of the ICs to be tested.

Further, while in the above embodiment the multi-testing of two ICs is performed, it is also possible to perform the multi-testing of three or more ICs by providing a number of dedicated clock circuits and dedicated strobing circuits.

What is claimed is:

1. An IC tester for simultaneously testing a plurality of IC's, each IC having at least one first terminal and at least one second terminal said IC tester comprising:
   a common timing generating circuit which is common to a plurality of IC's to be tested for generating a common timing signal and transmitting the common timing signal to the second terminals of the plurality of IC's;
   a plurality of dedicated timing generating circuits corresponding to the plurality of IC's to be tested, each dedicated timing generating circuit generating an independent timing signal and transmitting the independent timing signal to a first terminal of the corresponding IC;
   control means for operating the plurality of IC's with an identical operational timing by controlling said common timing generating circuit and said plurality of dedicated timing generating circuits so as to enable said IC's to be tested simultaneously.

2. An IC tester for simultaneously testing a plurality of IC's, each IC including a first input terminal and a first output terminal as well as a second input terminal and a second output terminal, said IC tester comprising:
   a plurality of drivers respectively connected to respective first and second input terminals of a plurality of IC's to be tested which supply testing signals to the first and second input terminals;
   a plurality of comparators which are respectively connected to respective first and second output terminals of the plurality of IC's to be tested and which make a judgment on output signals emitted through the first and second output terminals;
   a common clock circuit which is common to the plurality of IC's to be tested for generating a common clock signal and transmitting the common clock signal to the drivers connected to the second input terminals of the IC's;
   a common strobing circuit which is common to the plurality of IC's to be tested for generating a common judgement timing signal and transmitting the common judgement timing signal to the comparators connected to the second output terminals of the IC's;
   a plurality of dedicated clock circuits corresponding to the plurality of IC's to be tested, each dedicated clock circuit generating an independent clock signal and transmitting the independent signal to the drivers connected to the first input terminals of the IC's;
   a plurality of dedicated strobing circuits corresponding to the plurality of IC's to be tested, each dedicated strobing circuits generating an independent judgement timing signal and transmitting the independent judgement timing signal to the comparators connected to the first output terminals of the IC's; and
   control means for operating the plurality of IC's with an identical operational timing by controlling said drivers, said comparators, said common clock circuit, said common strobing circuit, and dedicated clock circuits and said dedicated strobing circuits so as to enable said IC's to be tested simultaneously.

* * * * *